(12) United States Patent
Burgess et al.

(10) Patent No.: US 9,048,066 B2
(45) Date of Patent: Jun. 2, 2015

(54) METHOD OF ETCHING (71) Applicant: SPTS TECHNOLOGIES LIMITED, Coed Rhedyn, Newport (GB)

(72) Inventors: Stephen R Burgess, Gwent (GB); Alex Theodosiou, Caerphilly (GB)

(73) Assignee: SPTS TECHNOLOGIES LIMITED, Newport (GB)

( * ) Notice: Subject to any disclaimer, the term of this patent is extended or adjusted under 35 U.S.C. 154(b) by 62 days.

(21) Appl. No.: 13/934,531

(22) Filed: Jul. 3, 2013

(65) Prior Publication Data
US 2014/0008325 A1  Jan. 9, 2014

Related U.S. Application Data (60) Provisional application No. 61/667,443, filed on Jul. 3, 2012.

(51) Int. Cl.
*H01J 37/20* (2006.01)
*H01J 37/32* (2006.01)

(52) U.S. Cl.
CPC ............... *H01J 37/20* (2013.01); *H01J 37/321* (2013.01); *H01J 37/32862* (2013.01); *H01J 2237/334* (2013.01)

(58) Field of Classification Search
CPC ... H01J 37/20; H01J 37/321; H01J 37/32862; H01J 2237/334
USPC ...................................... 216/67, 68
See application file for complete search history.

(56) References Cited

U.S. PATENT DOCUMENTS

| | | | |
|---|---|---|---|
| 2002/0074014 A1 | 6/2002 | Yeh | |
| 2004/0180556 A1* | 9/2004 | Chiang et al. | 438/781 |
| 2005/0106884 A1 | 5/2005 | Ren | |
| 2005/0191827 A1 | 9/2005 | Collins et al. | |
| 2005/0224458 A1 | 10/2005 | Gaudet et al. | |
| 2005/0258137 A1 | 11/2005 | Sawin et al. | |
| 2006/0172525 A1* | 8/2006 | Werner et al. | 438/624 |
| 2009/0246399 A1 | 10/2009 | Goundar et al. | |
| 2011/0114113 A1 | 5/2011 | Honda | |

FOREIGN PATENT DOCUMENTS

| | | |
|---|---|---|
| EP | 1619267 A2 | 1/2006 |
| JP | 2011146596 | 7/2011 |

OTHER PUBLICATIONS

Search Report From Related Application GB1211922.8 Dated Dec. 18, 2012.
Search Report From Related Application 13275153.8 Dated Oct. 15, 2013.

* cited by examiner

*Primary Examiner* — Duy Deo
*Assistant Examiner* — Mahmoud Dahimene
(74) *Attorney, Agent, or Firm* — Volentine & Whitt, PLLC (57) ABSTRACT

A method is for etching successive substrates on a platen in an inductively coupled plasma chamber in which the etching process results in carbonaceous deposits in the chamber. The method includes (a) interrupting the etching processing of substrates, (b) running an oxygen or oxygen containing plasma within the chamber and removing gaseous by-products, and (c) resuming the etch processing of substrates. The method is characterized in that it further includes the step of running an argon plasma in the chamber after step (b) with the platen biased.

12 Claims, 7 Drawing Sheets

HSE chamber schematic

HSE chamber schematic

| Ar Recovery Plasma Platen Power | Initial Etch Rate (Å/min) | Etch Rate After O$_2$ Treatment (Å/min) | Etch Rate After AR Recovery (Å/min) | % Recovery | % of Original Value | NU(% 1σ) |
|---|---|---|---|---|---|---|
| 0 (ie Coil Only) | 400 | 320 | 337 | 21 | 84 | 5.93 |
| 200 W | 395 | 327 | 359 | 47 | 91 | 4.3 |
| 400 W | 392 | 328 | 374 | 72 | 95 | 4.52 |
| 800 W | 395 | 331 | 380 | 77 | 96 | 4.3 |

Fig. 7

METHOD OF ETCHING

BACKGROUND

This invention relates to a method of etching successive substrates on a platen in a chamber in which the etching process results in carbonaceous deposits in the chamber.

A number of etching processes may result in carbonaceous deposits in the etched chamber. This is particularly true when processing polyimide (PI) coated silicon wafers, which are widely used in the semi-conductor and other related industries. Prior to metal deposition it is common and desirable to remove material from the wafer surface by a sputter etch process (typically using Ar) in order to ensure a high quality metal/metal interface. This step is normally conducted in a physical vapour deposition (PVD) pre-clean module. However, prolonged or frequent etching of PI wafers through the PVD pre-clean module can lead to a build-up of sputtered material around the chamber lid and walls. This carbonaceous material can accumulate to such a level that particles can become loose and begin to move around the chamber, particularly during processing, and there is the potential for them falling onto and contaminating the wafers.

It is known to seek to combat this problem by frequent use of an oxygen plasma. The oxygen step may be relatively short (e.g. 60 s) and act as a conditioning step where no platen bias is required. It is believed that the introduction of an oxygen plasma into a carbonised chamber will promote carbon oxidation, leading to $CO/CO_2$ which may readily be pumped away. The removal of the material lowers the particle count.

Figure 1:
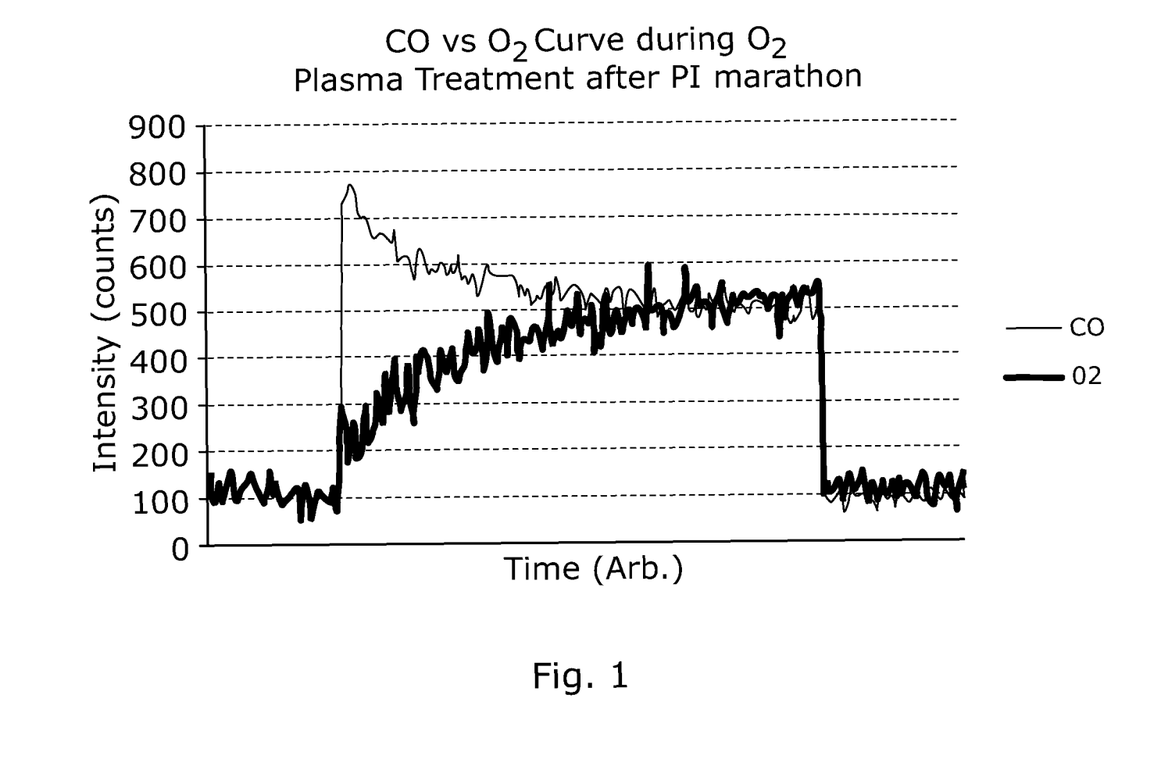
FIG. 1 plot of CO vs $O_2$ during $O_2$ plasma treatment after PI processing.

As can be seen in FIG. 1, the Applicants have monitored the whole process through optical spectroscopy. During the initial stages of the oxygen plasma, $O_2$ levels within the chamber are low whilst CO levels appear high. Presumably the Oxygen is converting the carbon species, present from the PI etching, to CO before reaching equilibrium.

The frequency of the oxygen plasma treatment tends to be selected by the customer depending on the rate of particle formation they experience and any other requirements they may have. However, for a typical Ar sputter clean etch where 150-300 Å $SiO_2$ (or equivalent) is removed prior to the subsequent deposition step, it is likely that, within 50 to 100 PI coated wafers, an $O_2$ plasma clean will be required. Although this process provides effective particle control, the Applicants have discovered that following such oxygen treatment there is a sharp reduction in etch rate directly afterwards. The drop in etch rate has been measured to be between 20 to 30%. This obviously leads to significant lack of uniformity between successive wafers and many semi-conductor manufacturers would not have accepted this initial drop in etch rate or the resultant drop in throughput, if they had been aware of the problem.

SUMMARY

The present invention consists in a method of etching successive substrates on a platen in a chamber in which the etching process results in carbonaceous deposits in the chamber, the method including:
  (a) interrupting the etch processing of substrates;
  (b) running an oxygen of oxygen-containing plasma within the chamber and removing the gaseous by-products; and
  (c) resuming the etch processing of substrates.
  characterised in that the method further includes the step of:
  (d) running an argon plasma in the chamber after step (b) with the platen biased.

Preferably step (d) lasts for between 500 seconds and 1200 seconds and it is particularly preferred to run step (d) for around 600 seconds.

The platen is preferably RF biased in which case the RF bias power may be between 400 watts and 1000 watts. An RF bias power of about 800 w is particularly preferred.

Conveniently the argon plasma is an inductively coupled plasma.

Although the invention has been defined above, it is to be understood that it includes any inventive combination of the features set out above or in the following description.

BRIEF DESCRIPTION OF THE DRAWINGS

The invention may be performed in various ways and they will now be described, by way of example, embodiments of the invention with reference to the accompanying drawings, in which.

DETAILED DESCRIPTION OF EMBODIMENTS

Figure 2:
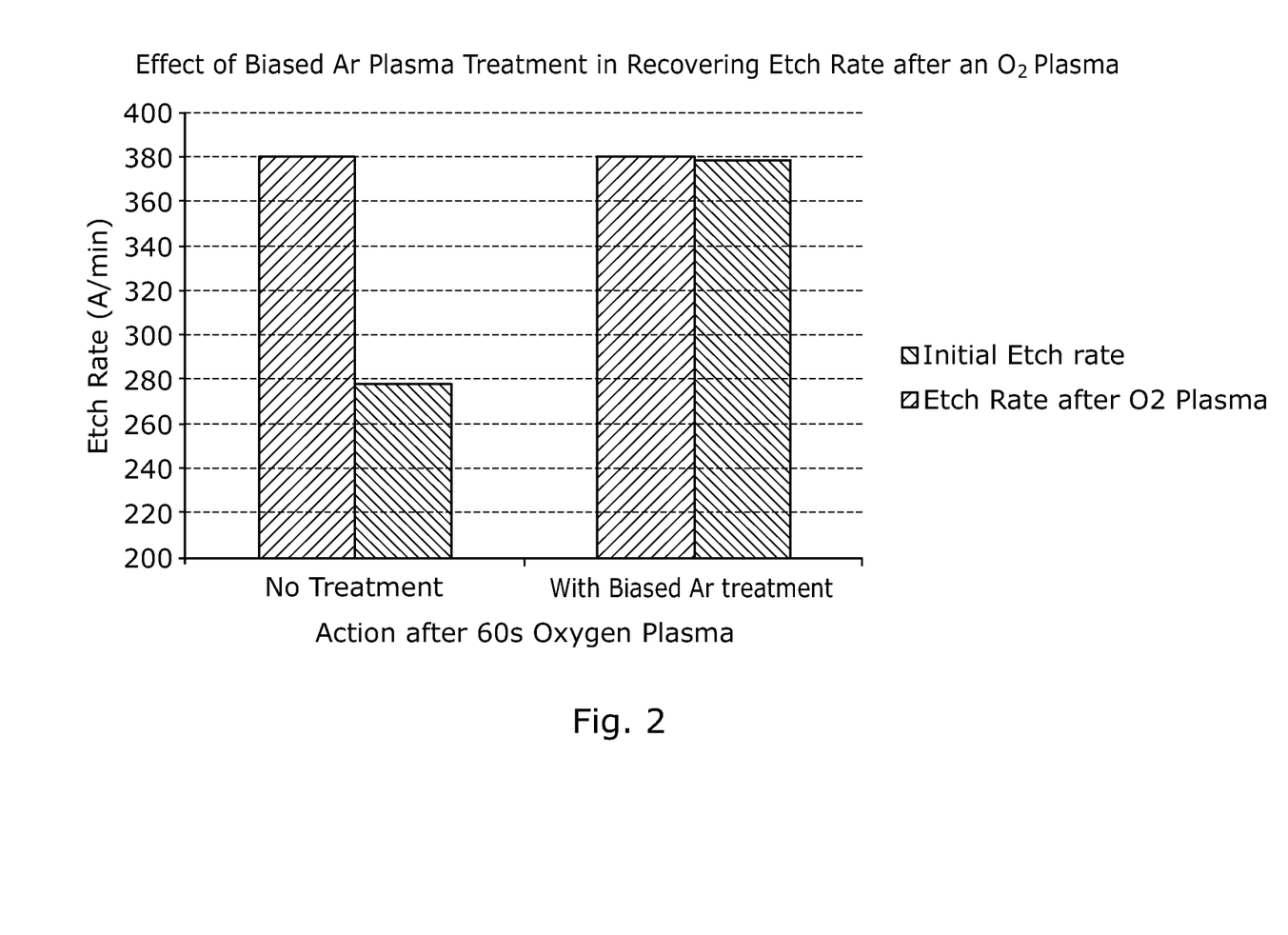
FIG. 2 is a plot of etch rates before and after an $O_2$ plasma treatment where the $O_2$ plasma treatment is used alone or in combination with a subsequent Ar treatment.

As has already been indicated in connection with FIG. 1, the issue of carbonaceous deposits can be successfully dealt with using an intermittent $O_2$ plasma step. However, as is well demonstrated in FIG. 2 on the left-hand side, if the normal argon plasma etch is carried out then there is a significant drop in etch rate. However, the Applicants have determined that surprisingly if the chamber is subjected to a biased Ar plasma then the drop in etch rate is almost negligible as can be seen on the right-hand side of FIG. 2.

Specifically after the $O_2$ an Ar plasma is struck in the chamber and the platen subjected to bias.

Figure 3:
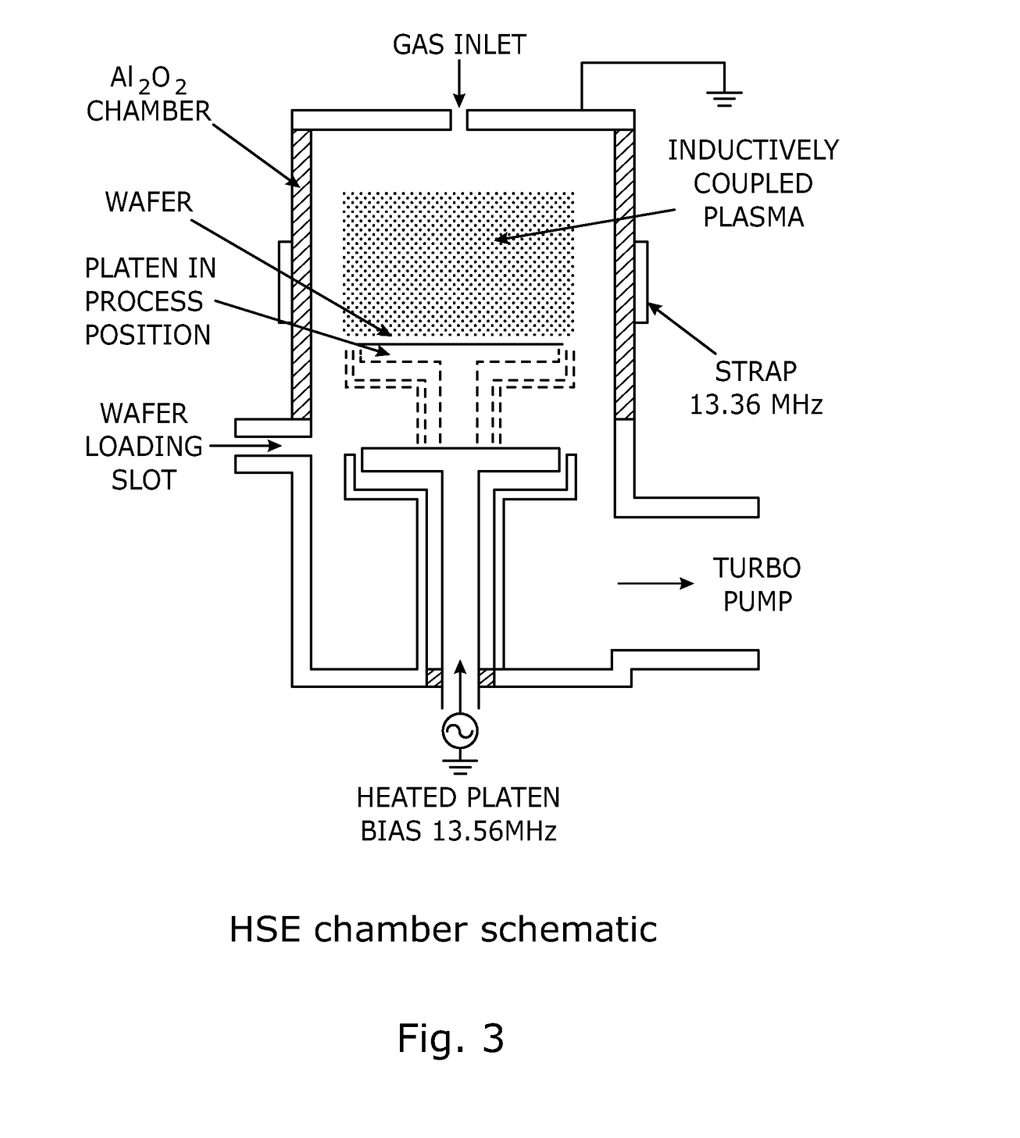
FIG. 3 is a schematic view of a PVD chamber utilised in embodiments of the invention.

A schematic representation of a PVD pre-clean module is illustrated in FIG. 3. The module, generally indicated at 10, comprises a ceramic chamber 11 having a gas inlet 12, a platen 13, which is moveable between a wafer load position and a processing position, an encircling strap 14 for inductively coupling a plasma 15 in the chamber in a known manner and an exhaust port 16. The platen is connected to an RF supply 17 for biasing a platen.

This module is used to clean a wafer prior to a metal deposition step in the PVD system. A wafer is placed on the platen assembly in the vacuum chamber which strikes a plasma using the strap 14, which is connected to an RF source not shown and the RF supply to the platen.

After sputter etching the polyimide wafers with Ar containing plasma the ceramic walls and the chamber lid become coated with carbon deposits which are emitted from the high carbon surface. The carbon deposits are removed by an $O_2$-based plasma step as previously described. After the oxygen treatment it is likely that some of the oxygen will reside within the internal chamber ceramic and the gas entry point at the top of the chamber; this oxygen may be agitated by the temperature rise during plasma processing and therefore diffuse out into the chamber, altering the nature of the plasma and consequently lowering the etch rate.

The Argon recovery plasma works by exposing the chamber to high temperature and this causes diffusion of oxygen trapped in the chamber body out into the plasma, in the gaseous state. After a certain amount of time enough oxygen will have been removed from the ceramic walls to restore the etch rate to its original value. This process is carried out either with a dummy wafer or on a ceramic-coated platen that is able to be etched.

The Ar sputter etch and the Ar conditioning step have very similar process conditions. The Ar conditioning step would preferably be carried out on a thick ceramic platen (e.g. several mm thick) in order that no conditioning wafer is required.

The etch data of the chamber at a given time can be determined by running a test on a $SiO_2$ wafer by measuring the thickness before and after of known duration of plasma etch. Results at various stages of the processing of PI wafers are shown below.

TABLE 1

Data of etch rate variation throughout different stages of the process.

| Chamber Condition | Etch Rate (Å/min) | Etch NU (% 1σ) |
|---|---|---|
| Initial Etch Rate | 381 | 3.70 |
| After 10 PI Wafers | 392 | 4.15 |
| After 60 s O2 Plasma | 279 | 4.81 |
| After 600 s Ar Recovery | 380 | 4.39 |

It will be seen that approximately a 30% drop in etch rate results from the oxygen plasma treatment and this can be fully recovered to its original value after a 600 second bias argon recovery plasma.

Figure 4:
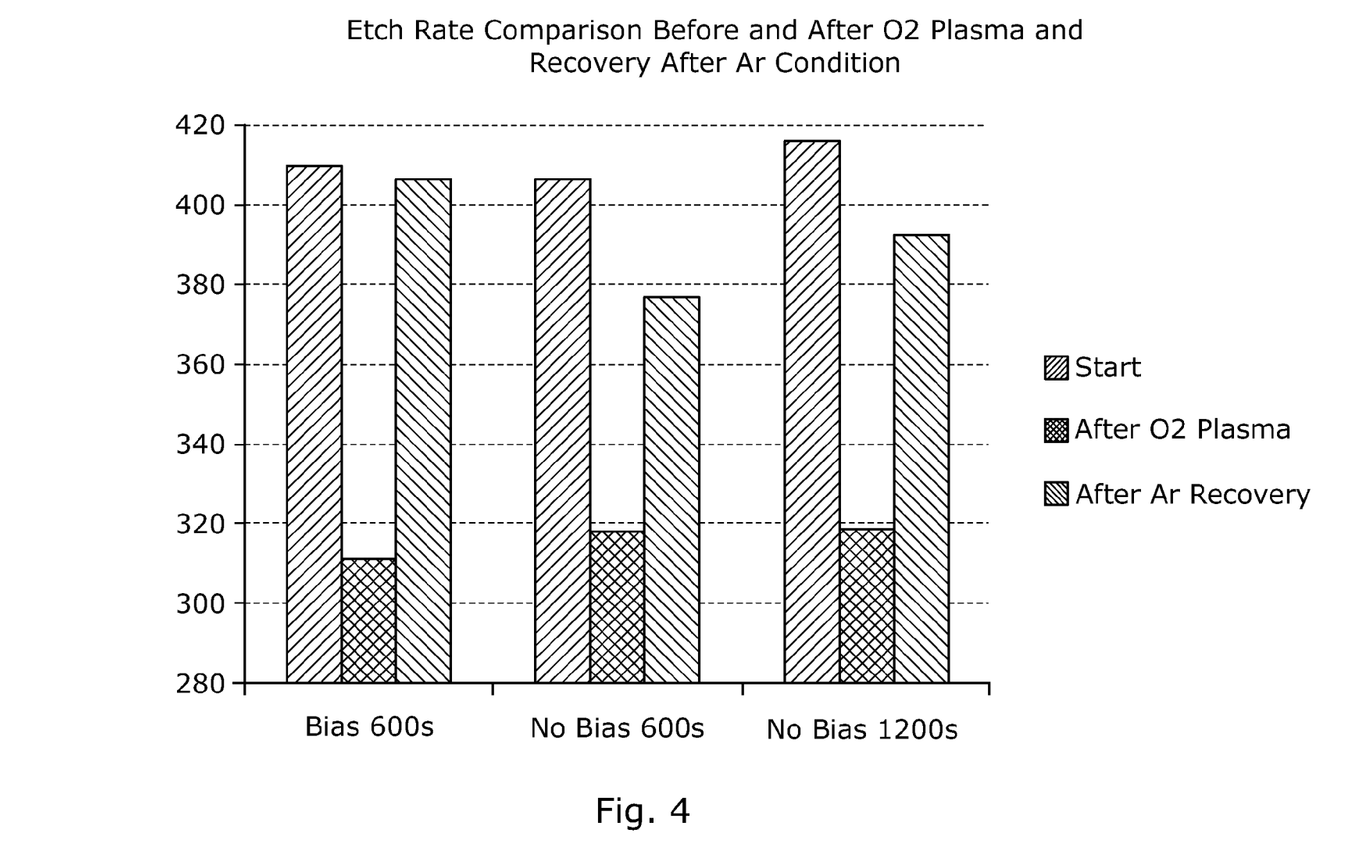
FIG. 4 shows comparative plots of etch rate for certain conditions.

In FIG. 4 the significance of the platen bias can be seen with much lower recovery rates if the argon treatment is run without bias.

A 600 second bias plasma resulted in a >99% recovery. The etch rate is in general known to be related to the density of the plasma and hence the ion flux at the surface of the wafer. Plasma density can be monitored using an optical microscope to detect the intensity of the light emitted. Typically an optical emission spectrometer is used to detect the intensity of light emitted at various frequencies (e.g. in FIG. 5 where $O_2$=772 nm and Ar=763 nm). The integrated plasma intensity which is related to rotation flux is typically greater for an unbiased peak than in biased cases. However, when the intensity of a non-biased plasma was increased by increasing the gas flow (600 sccm) and coil power (1500 w) to match the density of the bias plasma, the etch rate still did not improve.

Figure 5:
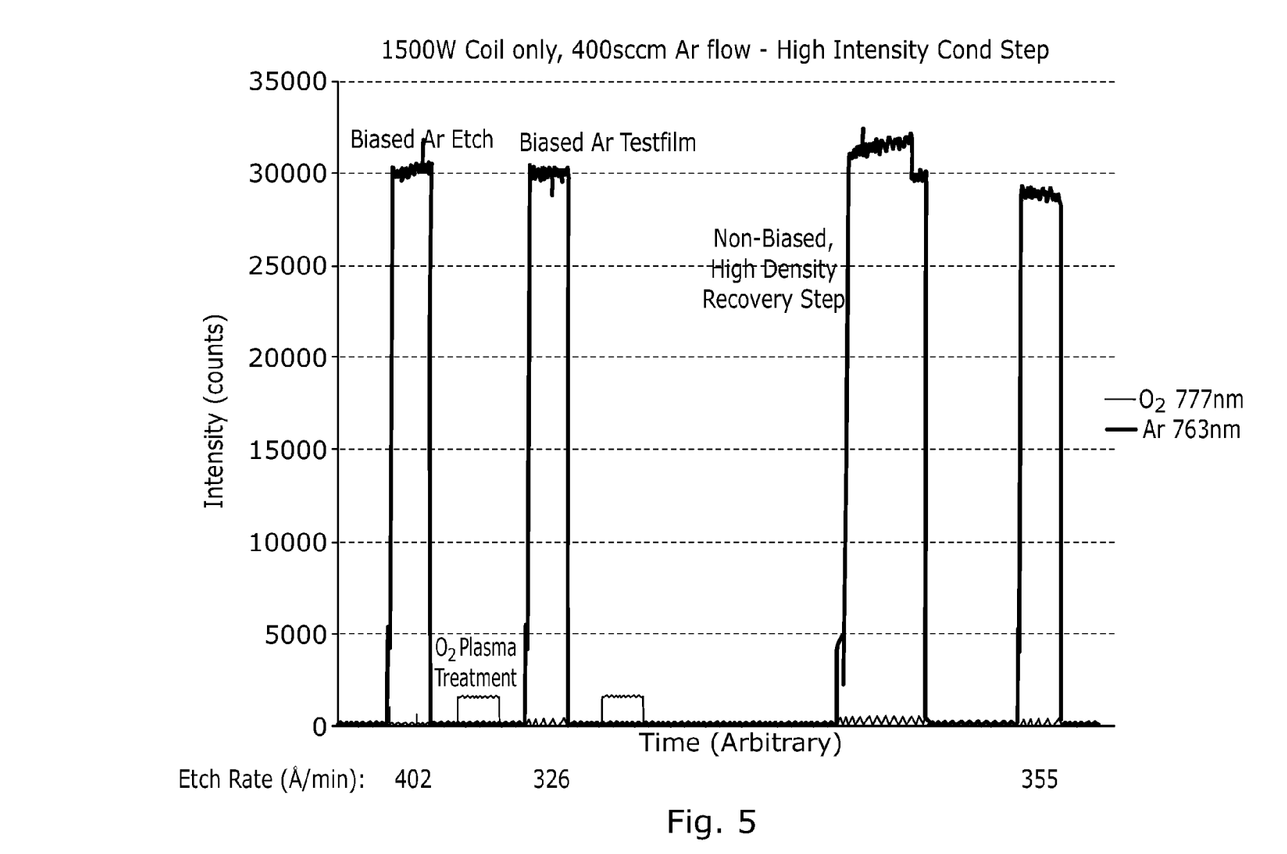
FIG. 5 is a plot showing etch rate as a factor of bias or plasma density.

FIG. 5 shows the optical spectrum obtained during Ar and $O_2$ plasma processing, the high intensity non-biased Ar recovery step is highlighted and the measured etch rates are also displayed.

The plasma intensity observed for the recovery step is slightly higher than the biased argon plasma in this case and yet still the recovering etch rate is not as good as an equivalent biased plasma. It would therefore appear that the platen bias is playing a role separate from increasing plasma intensity in achieving the unexpected etch rate recovery.

Figure 6:
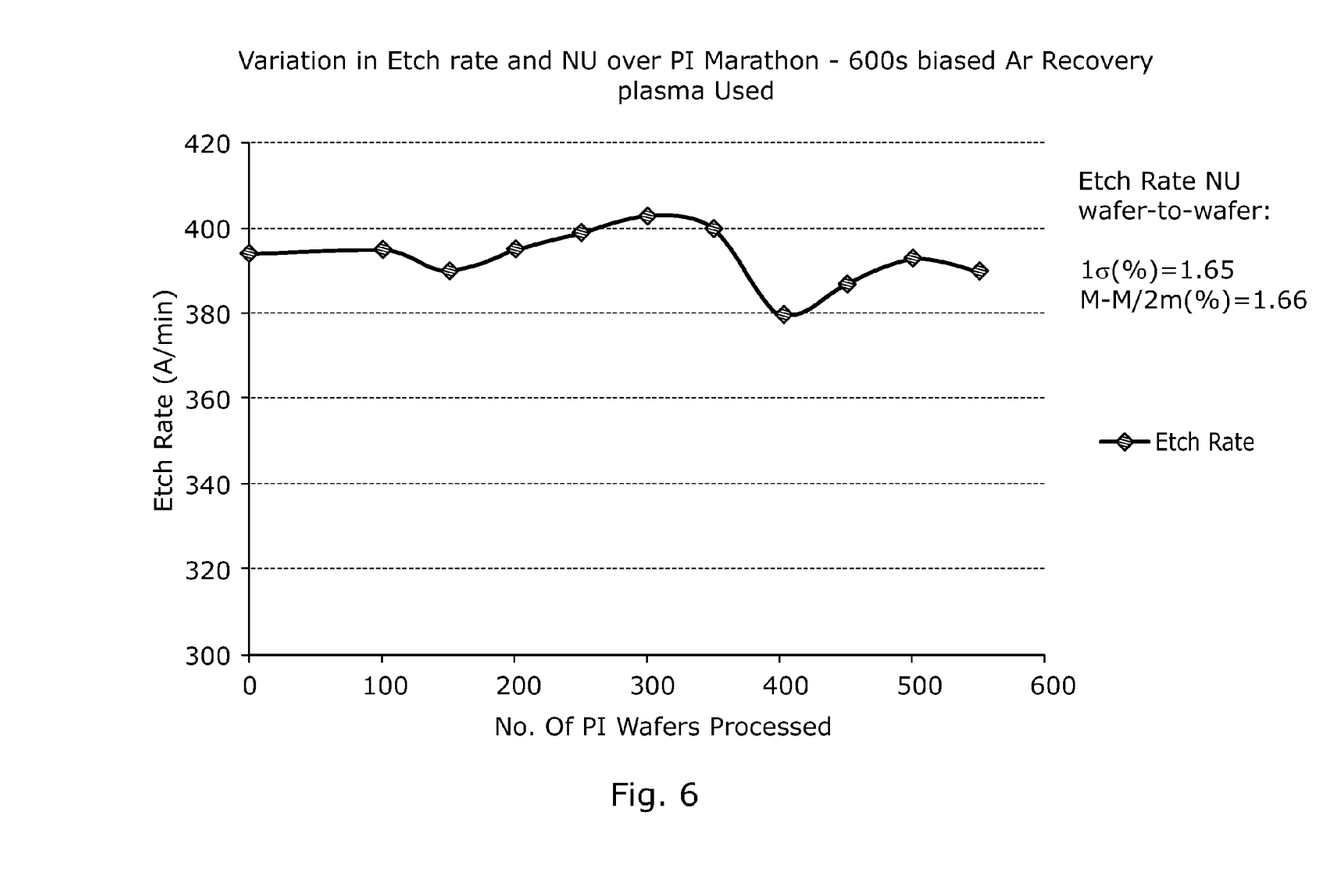
FIG. 6 illustrates the etch rate stability resulting from the use of an embodiment of the invention.

FIG. 6 illustrates the stability of etch rate recovery with 600 s biased Ar plasma. This shows the results obtained after processing 550 PI wafers, with $O_2$/Ar recovery step occurring after every 50 wafers. The etch rate has a wafer to wafer non-uniformity 1σ (%) of 1.65 which is within most customer specifications.

Figure 7:
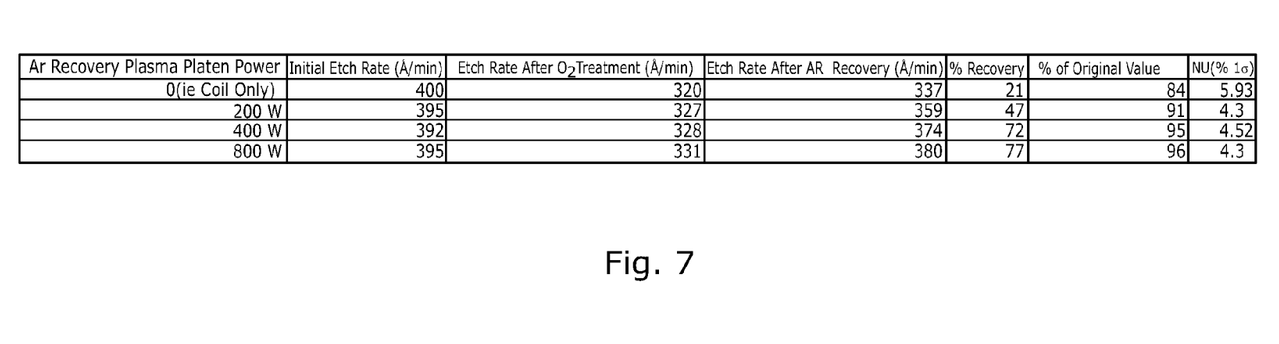
FIG. 7 shows the comparative etch rate recovery for various bias conditions.

The table in FIG. 7 illustrates the relationship between recovery and bias. Increasing bias improves the rate of recovery but between 400 and 800 watts the increase in improvement is limited and a preferred process would run at 600 watts.

What is claimed is:

1. A method comprising a process of etching substrates in succession on a platen in an inductively coupled plasma chamber, the process resulting in carbonaceous deposits in the chamber, and wherein the method includes:
   (a) interrupting the process of etching the substrates in succession;
   (b) while the process is interrupted according to step (a), removing carbonaceous deposits from the chamber by running an oxygen or oxygen containing plasma within the inductively coupled plasma chamber and removing gaseous by-products from the inductively coupled plasma chamber; and
   (c) subsequently resuming the process of etching the substrates in succession; and
   (d) running an argon plasma in the inductively coupled plasma chamber during a period after step (b) and before step (c) with the platen biased.

2. A method as claimed in claim 1 wherein the running of the argon plasma in the inductively coupled plasma in step (d) lasts for between 500 seconds and 1200 seconds.

3. A method as claimed in claim 2 wherein the running of the argon plasma in the inductively coupled plasma in step (d) lasts for about 600 seconds.

4. A method as claimed in claim 1 wherein the platen is RF biased.

5. A method as claimed in claim 4 wherein the RF bias power is between 400 w and 1000 w.

6. A method as claimed in claim 5 wherein the RF bias power is about 800 w.

7. A method as claimed in claim 1 wherein the argon plasma is an inductively coupled plasma.

8. A method as claimed in claim 1 in which the carbonaceous deposits are carbon deposits.

9. A method as claimed in claim 1 in which step (d) is carried out while a dummy wafer is disposed on the platen.

10. A method as claimed in claim 1 in which the platen is a ceramic-coated platen that is capable of being etched under conditions present in the chamber during step (d), and step (d) is carried out without any substrate or wafer being disposed thereon.

11. A method as claimed in claim 10 in which the process is a process of sputter etching the polyimide-coated silicon wafers with plasma comprising argon.

12. A method comprising a process of etching polyimide-coated silicon wafers in succession on a platen in an inductively coupled plasma chamber, the process resulting in carbon deposits in the chamber, and wherein the method includes:
   (a) interrupting the process of etching of the polyimide-coated silicon wafers in succession;
   (b) while the process is interrupted according to step (a), removing carbon deposits from the inductively coupled plasma chamber by running an oxygen or oxygen containing plasma within the inductively coupled plasma chamber and removing gaseous by-products from the inductively coupled plasma chamber; and
   (c) subsequently resuming the process of etching the polyimide-coated silicon wafers in succession; and (d) running an argon plasma in the inductively coupled plasma chamber during a period after step (b) and before step (c) with the platen biased.

* * * * *